(12) United States Patent
Collet et al.

(10) Patent No.: US 7,838,393 B2
(45) Date of Patent: Nov. 23, 2010

(54) PROCESS FOR COLLECTIVE MANUFACTURING OF SMALL VOLUME HIGH PRECISION MEMBRANES AND CAVITIES

(75) Inventors: Joel Collet, Saint Martin d'Uriage (FR); Stephane Nicolas, Meylan (FR); Christian Pisella, Beaucroissant (FR)

(73) Assignee: Tronic's Microsystems, Crolles (FR)

( * ) Notice: Subject to any disclaimer, the term of this patent is extended or adjusted under 35 U.S.C. 154(b) by 0 days.

(21) Appl. No.: 12/298,894

(22) PCT Filed: Apr. 26, 2007

(86) PCT No.: PCT/EP2007/054106
§ 371 (c)(1),
(2), (4) Date: Oct. 28, 2008

(87) PCT Pub. No.: WO2007/128705
PCT Pub. Date: Nov. 15, 2007

(65) Prior Publication Data
US 2009/0130822 A1    May 21, 2009

Related U.S. Application Data

(60) Provisional application No. 60/838,814, filed on Aug. 17, 2006.

(30) Foreign Application Priority Data
Apr. 28, 2006    (FR) .................................. 06 51511

(51) Int. Cl.
*H01L 21/46* (2006.01)
*H01L 21/302* (2006.01)
*H01L 21/461* (2006.01)

(52) U.S. Cl. ....................... 438/459; 438/737; 438/752; 438/753

(58) Field of Classification Search ................. 438/459, 438/737, 752, 753; 257/E21.705, E21.219
See application file for complete search history.

(56) References Cited

U.S. PATENT DOCUMENTS 5,374,564 A    12/1994    Bruel (Continued)

FOREIGN PATENT DOCUMENTS

DE    19719861 A1    5/1997

(Continued)

OTHER PUBLICATIONS

Hu, Min, "A Silicon-On-Insulator Based Micro Check Valve", Journal of Micromechanics & Microengineering, vol. 4, No. 3, pp. 382-387 (Mar. 1, 2004).

(Continued)

*Primary Examiner*—William M. Brewster
(74) *Attorney, Agent, or Firm*—Nixon Peabody LLP

(57) ABSTRACT

The invention relates to a process for collective manufacturing of cavities and/or membranes (24), with a given thickness d, in a wafer said to be a semiconductor on insulator layer, comprising at least one semiconducting surface layer with a thickness d on an insulating layer, this insulating layer itself being supported on a substrate, this process comprising:

etching of the semiconducting surface layer with thickness d, the insulating layer forming a stop layer, to form said cavities and/or membranes in the surface layer.

16 Claims, 11 Drawing Sheets

U.S. PATENT DOCUMENTS

| | | |
|---|---|---|
| 6,261,066 B1 | 7/2001 | Linnemann et al. |
| 6,395,638 B1 | 5/2002 | Linnemann et al. |
| 2004/0012460 A1 | 1/2004 | Cho et al. |
| 2006/0094175 A1* | 5/2006 | Cohen et al. ............. 438/190 |

FOREIGN PATENT DOCUMENTS

| | | |
|---|---|---|
| DE | 19719862 A1 | 5/1997 |
| FR | 2681472 | 9/1991 |
| GB | 2371119 A | 7/2002 |
| WO | 0190577 A1 | 11/2001 |

OTHER PUBLICATIONS

Renard, Stephane et al., "Capacitive Pressure and Inertial Sensors by Epi-Soi Surface Micromachining", Proceedings of IEEE Sensors 2002, Jun. 12-14, 2002 IEEE International Conference on Sensors, vol. 1 of 2, Conf. 1, pp. 1385-1388 (Jun. 12, 2002).

French Preliminary Search Report, FR 0651511, dated Dec. 26, 2006.

International Search Report, PCT/EP2007/054106, dated Aug. 2, 2007.

* cited by examiner

PROCESS FOR COLLECTIVE MANUFACTURING OF SMALL VOLUME HIGH PRECISION MEMBRANES AND CAVITIES

CROSS REFERENCE TO RELATED APPLICATIONS OR PRIORITY CLAIM

This application is a national phase of International Application No. PCT/EP2007/054106, entitled "PROCESS FOR COLLECTIVE MANUFACTURING OF SMALL VOLUME HIGH PRECISION MEMBRANES AND CAVITIES", which was filed on Apr. 26, 2007, and which claims priority of French Patent Application No. 06 51511, filed Apr. 28, 2006 and U.S. Provisional Patent Application No. 60/838,814, filed Aug. 17, 2006.

TECHNICAL DOMAIN AND PRIOR ART

The invention relates to the field of collective manufacturing of cavities or membranes or micropumps, with high precision dimensional control.

The invention is applicable particularly to manufacturing of components made of a semiconducting material, for example silicon requiring a precise volume control, useful for micro-fluidic and micro-pneumatic applications.

The invention can be used in microfluidics to make micropumps and membranes to control the input of micro-volumes of liquids, for example of the order of a nanoliter or picoliter.

Another application of the invention is manufacturing of devices for the controlled reproducible and high precision distribution of small quantities of liquid or gas products, particularly for proportioning of products in quantities measured in micro-liters or nano-liters or less.

Such fluidic components are disclosed in documents DE 19719861 and DE 19719862.

At the present time, cavities and membranes in silicon devices are made from silicon plates by dry or wet etching. Values of membrane and cavity thicknesses are directly dependent on the initial silicon wafer (its thickness and the tolerance on this thickness) and on the etching process used (etching speed, process uniformity).

To achieve a high precision of the order of one micron on etched thicknesses of several tens to several hundreds of microns, such a process requires measurements throughout the manufacturing period on a wafer (process uniformity) and from wafer to wafer (uniformity of wafer thicknesses and the process). This leads to a high manufacturing cost due to the need to carry out precision checks many different times and with high precision instruments.

Therefore, due to tolerances on wafer thicknesses and the process, high precision is only possible if the wafers are treated individually with frequent checks and with the risk of a reduction in the manufacturing success rate if the process is not sufficiently uniform.

Therefore, the problem that arises is that wafers have to be treated individually.

With the known process, collective batch manufacturing for devices that require very tight thickness tolerances (of the order of one μm) is impossible. This is due to non-homogeneity of the etching process and non-homogeneity of the thickness of semiconducting wafers (on one wafer and from wafer to wafer).

A first problem that this invention is intended to solve is to find a process capable of treating wafers collectively.

The known technique also requires that precise repeated dimensional checks are carried out on each of the wafers during the etching process. This type of check provides a means of determining the etched thickness and thus determining the remaining etching time to achieve the required thickness. Such a process must also be iterative to prevent speed variation effects due to the etching process used.

Furthermore, any sudden variation in the process can cause loss of the wafer. In particular, considering that it is a process based on the etching time, any sudden variation in the process (etching speed and/or etching homogeneity on the wafer) can result in an extra thickness above the specified thickness. The wafer will then be outside specification and rejected.

Therefore, this technique suffers from serious defects for mass production based on a collective batch process. Manufacturing of membranes and cavities for which tolerances are very tight (ultra precise control over valve opening pressures and cavity volumes in the above-mentioned application) is highly dependent on the homogeneity and reproducibility of the etching process used. Furthermore, the tolerance on the thickness of semiconducting wafers is additional to the non-homogeneity inherent to known manufacturing processes.

PRESENTATION OF THE INVENTION

The invention is intended to solve these problems.

It provides a process of manufacturing membranes and/or cavities with a precisely controlled thickness, in particular either collectively or in batches.

It relates firstly to a process for manufacturing at least one cavity and/or membrane with a given thickness, comprising:

selection of a wafer comprising a semiconducting surface layer with thickness d on an insulating layer, the insulating layer itself being supported on a substrate; for example it may be an SOI or double SOI wafer, etching of the surface layer, the insulating layer forming a stop layer to form said cavity and/or membrane in the surface layer.

Said cavity and/or membrane form means for introducing a fluid to closed or semi-closed volumes.

According to the invention, one or several wafers of specific materials, of the silicon on insulator (SOI) type, or more generally a "semiconductor on insulator" type, are used. In particular, SOI wafers obtained by epitaxy, or more generally standard SOI wafers obtained conventionally by bonding can be used.

The semiconducting layer, for example made of silicon in the case of an SOI, on an SOI wafer or on a wafer comprising a semiconducting surface layer with thickness d on an insulating layer itself supported on a substrate, has a controlled and precise thickness over the entire wafer. This is also the case for a batch of wafers, and from batch to batch. The thickness precision (presently of the order of one μm or less than one μm) is greater than or equal to the precision required for manufacturing of precision devices. The result is that the cavity or membrane made does not require any dimensional control after etching Furthermore, the process does not require any control over the etching speed, since etching is stopped when the stop layer is reached.

A mask may be positioned on or above the surface layer, before etching.

Several cavities or membranes may be made using the invention starting from a set of wafers.

These wafers can then be positioned and then assembled to form high precision closed or semi-closed volumes. One of the dimensions (commonly called the depth) is controlled by the thickness of the surface layer, while the other two dimensions (commonly called the width and the length) of the volume are controlled, for example by the mask of the etching process.

These wafers may be assembled directly or indirectly, with or without the addition of an intermediate material. The assembly may be of the molecular bonding type.

The invention thus also concerns a process for manufacturing, preferably collectively, of cavities and/or membranes and/or micro pumps, comprising a process being performed according to the invention, for each wafer in a batch of wafers.

The invention also relates to a process for manufacturing a micro-valve comprising:

the formation of at least one seat of said micro-valve in a semiconducting layer of a first semiconductor on insulator wafer, using the process according to the invention, the formation of at least one membrane of said micro-valve in a semiconducting layer of a second semiconductor on insulator wafer, using the process according to the invention, assembly of the first and second wafers through their front faces, so as to position the membrane on the seat.

Such a process can also comprise:

the formation in at least the first wafer, of at least one membrane and at least one seat in the surface layer of the semi conducting material of this wafer, and at least one seat and at least one membrane in the surface layer of semiconducting material of the second wafer, assembly of the first and second wafers through their front face, forming at least two micro-valves.

There may also be a step to make a cover in a third wafer, for example also an SOI type wafer, and a step to assemble this cover with at least one micro-valve. The cover may include at least one membrane. Membrane activation means, for example piezoelectric or electrostatic or pneumatic or magnetic means, may be made. The membrane may be delimited by two cavities made in the third wafer.

Due to the precision resulting from the use of one or a batch of SOI type wafers, a process according to the invention is particularly suitable for making membranes and cavities.

An assembly of wafers to each other using a transfer process from one of the wafers to the other by direct or indirect bonding, with or without the addition of an intermediate material, for example by molecular bonding, provides a means of making closed or semi-closed volumes, to which access is controlled by valves (with controlled thickness, made by a process according to the invention), and for which the volume can be varied by taking action on a membrane (with a thickness that is also controlled, made using a process according to the invention).

The moving elements (valves, flexible membranes, etc.) may be made using the described process on any wafer in the final stack and thus enable placement of these mobile elements inside the closed or semi-closed volume formed. This makes it possible to manufacture complex devices for which the mobile elements may be controlled by mechanical or electrical or magnetic or pneumatic or hydro-pneumatic type motor elements.

The thickness of the membranes and/or valves provides a means of controlling their stiffness, and the thickness of the cavities controls one of the dimensional parameters of the volume formed. This stiffness defines the volume displaced for a given mechanical action, or the pressure threshold at which the valves close or open.

The other two dimensions of the volume or the membranes and valves may be controlled by the masking step, for which the precision is much better than one µm. For example the masking techniques used are the microelectronic techniques for which precisions of the order of $\frac{1}{10}$ µm or even less are already possible.

The invention also relates to a micro-valve type device, comprising:

at least one seat of said micro-valve in a semiconducting layer in a first SOI wafer, at least one membrane of said micro-valve in a semiconducting layer in a second SOI wafer, the first and the second wafers being assembled such that said membrane is supported in an inactive position on said seat.

Such a device may comprise at least two micro-valve seats in said semiconducting layer of said first SOI wafer, and at least two micro-valve membranes in a semiconducting layer of the second SOI wafer.

According to another embodiment, such a device may also comprise a cover, made for example in a third wafer, forming a fluid circulation chamber with the two assembled wafers. This chamber may be delimited by a membrane made in the cover. For example said cover can be assembled with a micro-valve obtained by a process according to the invention.

Means of activation of the membrane may be provided, these activation means possibly being arranged in a cavity adjacent to the membrane.

All functions of a device according to the invention can be obtained by the assembly of several wafers.

Mechanical actions (cutting) can then be done to separate parts from each other and to adjust their dimensions, guaranteeing that no pollution will enter the closed or semi-closed volume formed, and without damaging mobile elements of the device (for example the valve).

Etching of the semiconductor (upper film or lower film) is preferably performed on batches of several wafers without carrying out any intermediate dimensional check. The buried oxide layer acts as an etching stop layer and the dimensions of the cavity and/or membrane formed are fixed solely by the thickness of the etched semiconducting film. The dimensions of the created structures are thus limited by the specifications of the manufacturer of the semiconductor on insulator wafers, and particularly by the thickness homogeneity of these wafers.

DETAILED DISCLOSURE OF PARTICULAR EMBODIMENTS

Figure 1A:
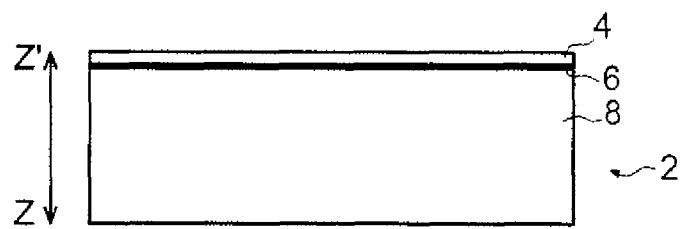
FIGS. 1A-1I show a first embodiment of a process according to the invention.
Figure 1B:
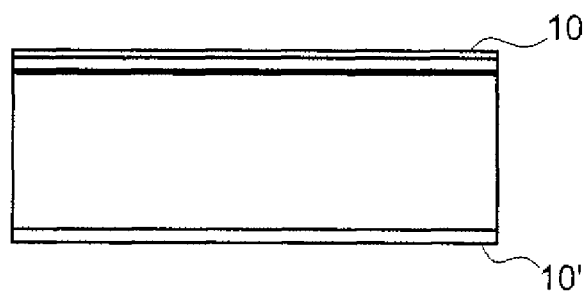

A first embodiment of the invention will be discussed with reference to FIGS. 1A-1E.

Starting from a wafer 2 (FIG. 1A) such as an SOI or more generally a wafer 4 of a semiconducting material on an insulating layer 6, the assembly being supported on a substrate 8, the invention can be used to make cavities and/or membranes with very well controlled dimensions, particularly for the thickness d.

For example, SOI structures are disclosed in document FR 2681472.

The wafer 2 may be of the SOI (Silicon on Insulator) type or a derivative (double SOI or EPI SOI), or more generally a semiconductor on insulator, for which the thickness d of the semiconductor surface film 4 is adapted to the needs of the device (thickness d and tolerance).

Typically, for example, the surface layer 4 made of silicon or another semiconducting material may have a thickness d equal to about 100 nm to 100 µm, while the thickness of the layer 6 is of the order of a few hundred nm or more, for example between 100 nm and 2 µm. The thickness d is very well controlled during manufacturing of the wafer, for example within ±1 µm.

A material 10, 10' (for example silicon nitride or a metal or an oxide or a resin, etc.) designed to form a mask for the subsequent etching steps, is deposited (FIG. 1B) on each side of the wafer 2. This material is structured according to first patterns, and the semiconducting film 4 is etched using a dry or wet etching process (FIG. 1C) to transfer said patterns 12 into the layer 4, the layer 6 forming the etching stop layer. This technique is used to etch the required patterns in the layer 4, with the required thickness determined by the thickness d of the layer 4. A check of this thickness after manufacturing is unnecessary because this check is done by the choice of the thickness d of the layer 4. Similarly, there is no need to control the etching speed because etching stops when the stop layer is reached.

The masking step controls two of the dimensions of the cavity or the membrane in the plane of the wafer 2 (this plane is perpendicular to the plane of the Figure). The precisions of the masking techniques are of the order of tenth of 1 µm or less.

The initial thickness of the layer 4 itself controls the precision of the etched patterns along a direction zz' perpendicular to the wafer 2.

These operations may be repeated or may be done simultaneously and therefore collectively, on one wafer or even on several wafers in a batch of wafers.

Figure 1C:
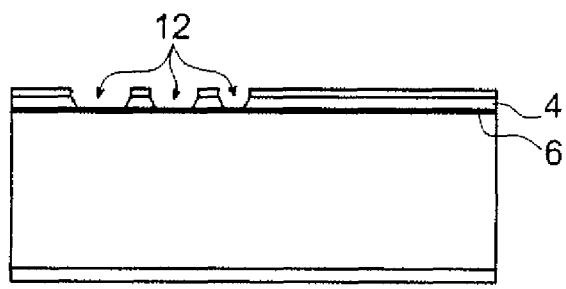
Figure 1D:
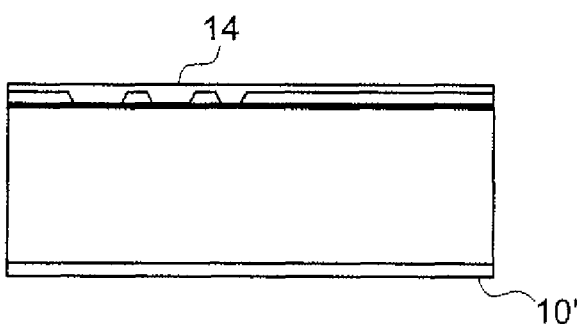
Figure 1E:
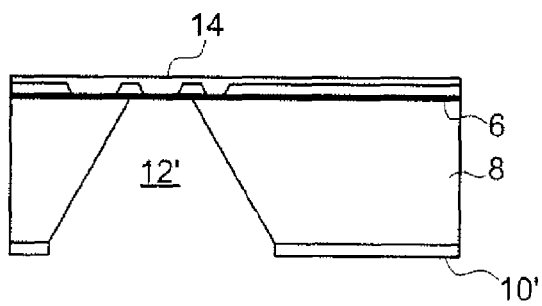
Figure 1F:
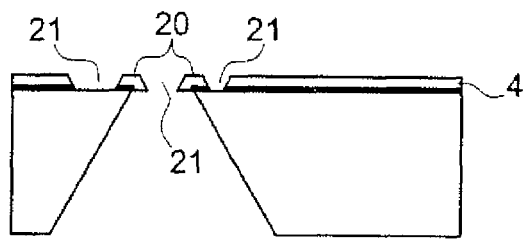

In FIG. 1F, the patterns 20 obtained were made in the layer 4 and therefore benefit from the precision of this layer along the zz' direction and the precision of the masking technique. They delimit one or several cavities 21 that are therefore also formed in the same layer with the same advantages in terms of precision.

The same operations can be carried out on the other face of the wafer (the back face) if necessary (FIG. 1E). Firstly, (FIG. 1D) a layer 14 of material 10 was deposited on the front face to protect it when the back face is being etched.

The etching step of the back face leads to the formation of patterns or cavities 12' in the substrate 8 (or "bulk"), the layer 6 possibly acting as the etching stop layer.

The nitride layers 14 on the front face and on the oxide layers 10' on the back face are then eliminated (FIG. 1F).

Another example component that can be made in the surface layer 4, from a semiconducting material, on a wafer 22 (with a structure similar to wafer 2), is a membrane 24.

Figure 1G:
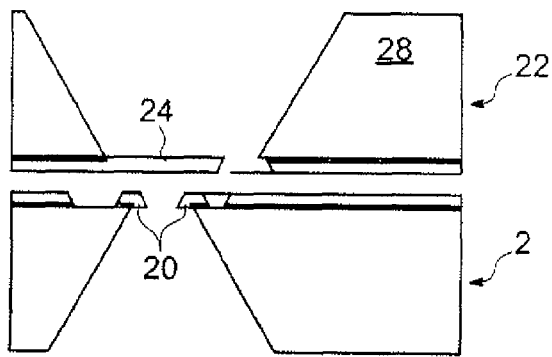

Such a membrane 24 is shown in the top part of FIG. 1G, and this membrane also benefits from the precision resulting from very good control over the thickness of this layer 4 and the precision of the etching masks. This membrane 24 is obtained by performing operations in the wafer 22 similar to those described above to make the cavities 21 and patterns 20 on the front face of the wafer 2, and to make the cavity 12 on the back face of this same wafer 2. The difference is in the form of the mask used, but the resulting precision is identical.

Figure 1H:
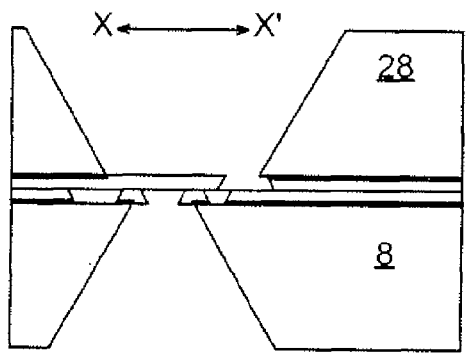
Figure 1I:
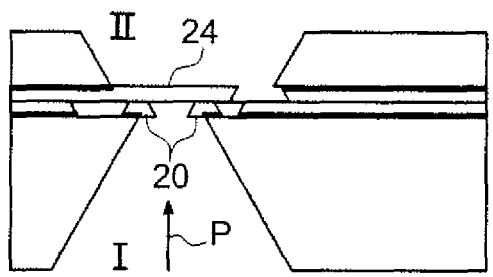

An example of a micro-fluidic device made using the process according to the invention is shown in FIG. 1I.

Such a component also comprises at least one valve seat 20 or a valve, and at least one membrane 24 supported on this seat.

Each of these two elements is made in the semiconducting surface layer of an SOI type substrate using the process explained above. Therefore the thickness of each of them is determined by the thickness of this surface layer, the precision of which may be high (for example be of the order of a few tenths of 1 µm, for example 0.5 µm).

Such a device can allow a fluid micro-volume to circulate applying a thrust P indicated in FIG. 1I, this thrust P possibly lifting the membrane 24 and allowing said micro-volume to pass from zone I to zone II. Such a micro-volume may for example of the order of a few picoliters or a few nanoliters.

The procedure described above is used to make such a device, both to make the part containing the seat 20 and the part containing the membrane 24.

The result thus obtained (FIG. 1F) is a first part of the device defining the seat 20 of a valve. The surface layer 4 did not have to be thinned for the formation of this seat or this valve, and the layer thickness was chosen to correspond to the thickness of the SOI.

FIG. 1F shows a single seat 20, but as mentioned above, a process according to the invention can be used to collectively make a plurality of seats on the surface of a wafer or several wafers.

The other wafers in the assembly may be prepared using the same process as that used on the first wafer, or a similar process.

Thus, a second wafer 22 may have been etched on the front face and then on the back face, so as to define a membrane 24 (formed in the manner already described above) that can act as a valve (FIG. 1G). The seat 20 of this membrane is defined by patterns exposed during etching of the front face of the first wafer 2.

The wafers thus obtained are assembled using a direct or indirect transfer technique, with or without the addition of intermediate material (FIGS. 1G and 1H). The volume produced may be precise, due to the assembly of semiconducting wafers with alignment (along the xx' axis, substantially parallel to the principal plane of SOI wafers) between each of the wafers with a precision of the order of 2 to 5 µm.

The product obtained may be reworked by etching processes or by mechanical processes (thinning, planing, etc.) so as to obtain the final structure. Thus the substrate 28 is thinned in FIG. 1I. But these thinning steps do not concern elements of the device for which the precision remains fixed by the choice of the thickness of the surface layer of SOI.

Therefore the result is a valve that can be activated by a fluid. The actuation thrust P of the membrane 24 is determined by the characteristics of the material from which this membrane is made, its thickness and its lateral dimensions. The thickness is controlled by the thickness of the initial surface semiconducting layer, for example within 0.5 µm.

The invention is not limited to the use of standard SOI (for example thin silicon-buried oxide—thick silicon) but may be applicable to any similar product (e.g. Double SOI: thin silicon-buried oxide—thin silicon-buried oxide—thick silicon). The buried oxide layer may be replaced by any other dielectric material (for example nitride). Materials other than silicon can be used, for example SiGe.

SOI wafers may be standard wafers, in other words bonded. According to one advantageous option within the scope of the invention, an EPI-SOI wafer is used, in other words a wafer in which the surface layer 4 is obtained by epitaxial growth, that offers even better thickness control than a standard SOI wafer.

Another example of a process for making a micro-fluidic device according to the invention is shown in FIGS. 2A-2I.

This shows an example of an SOI, knowing that semiconductors other than silicon can be used.

In such a process, patterns defining one or several seats 20, 20', and patterns defining one or several membranes 24, 24' are made in each wafer. Thus, FIG. 2I shows a device comprising two assemblies, each provided with a seat 20, 20' and a membrane 24, 24' supported on this seat in the rest position.

A process for manufacturing such a device will now be described.

Figure 2A:
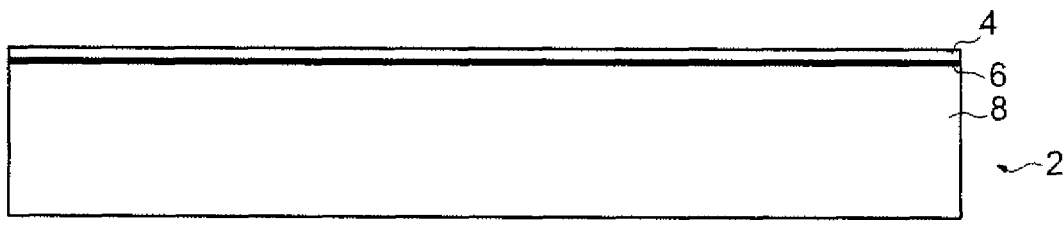
FIGS. 2A-2I show a second embodiment of a process according to the invention.

The first step is to select a first SOI wafer 2 (FIG. 2A). Once again, the thickness of the surface layer 4 is defined according to needs, and its precision may be of the order of a few tenths of a μm, for example 0.5 μm.

Figure 2B:
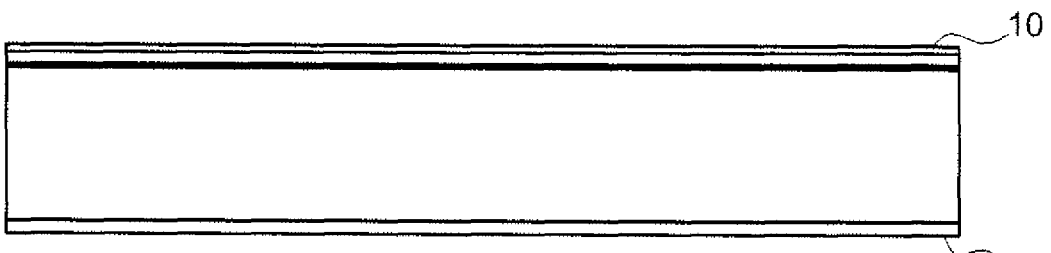

Two layers 10, 10', for example nitride $Si_3N_4$, are then formed, on the front and back face of this wafer (FIG. 2B).

Figure 2C:
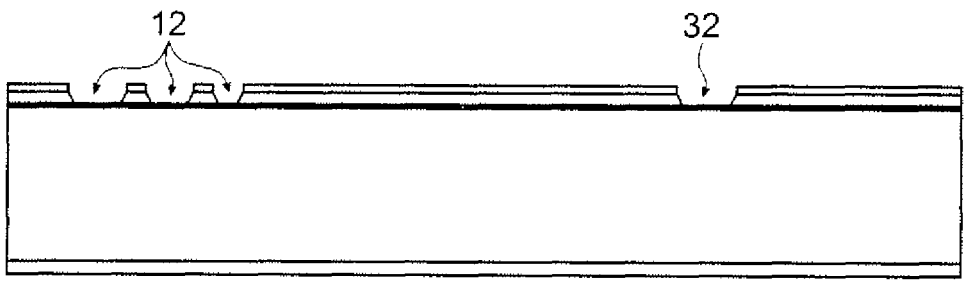
Figure 2D:
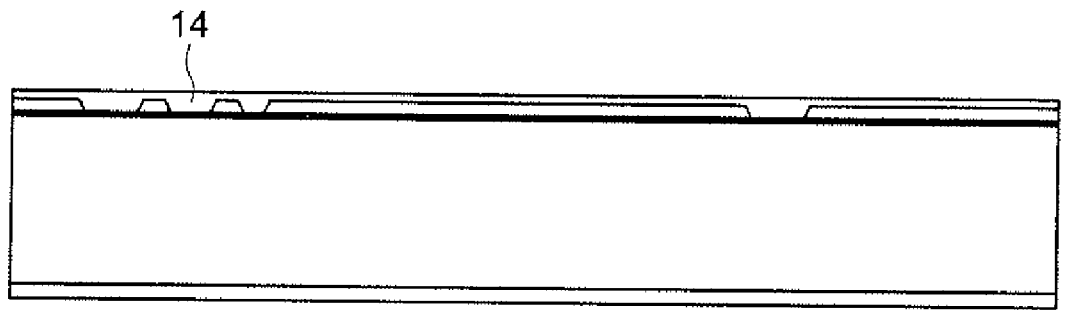
Figure 2E:
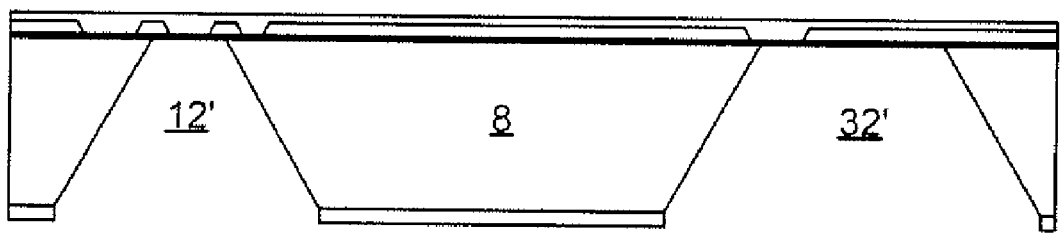

The layer 4 is etched on the front face of the wafer 2 to define patterns 12, 32, and therefore patterns or pads and cavities forming firstly at least one future seat and secondly a cavity delimiting at least a future membrane (FIG. 2C); the assembly can then be covered once again with a layer 14 of material 10 which once again performs a protective layer function (FIG. 2D).

Figure 2F:
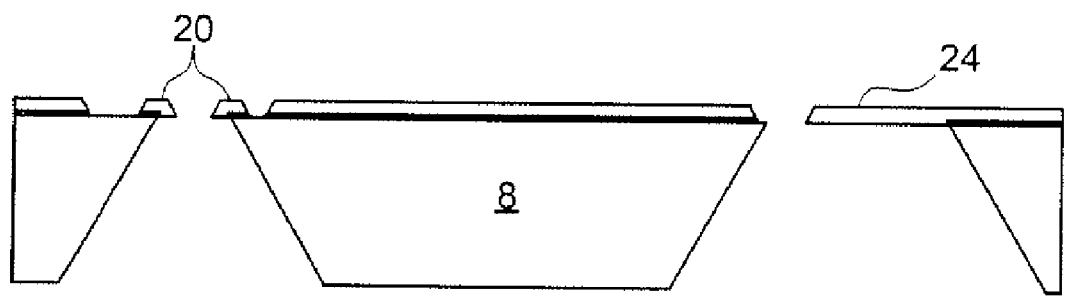
Figure 2G:
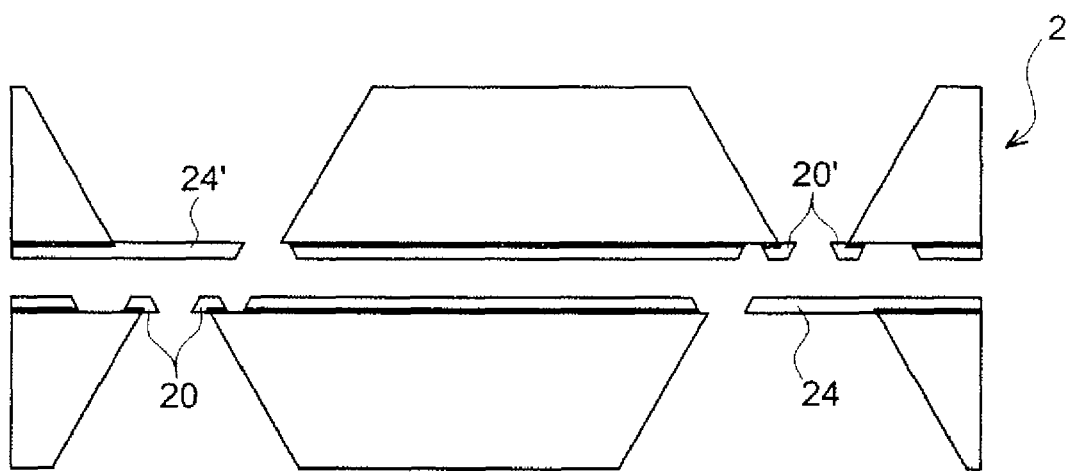
Figure 2H:
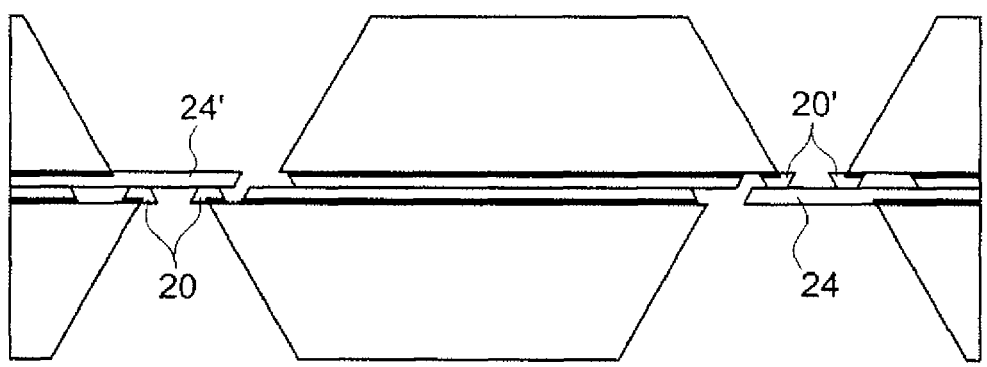
Figure 2I:

A back face etching is used to form one or several cavities 12', 32' in the substrate 8 (FIG. 2E); the nitride or oxide layers 14, 10' are then eliminated to expose the membrane(s) 24 and the seat(s) 20 (FIG. 2F).

A thinning and/or polishing step can then be performed.

The next step is to align two wafers with respect to each other, the front faces (on which the surface layer 4 of semiconducting material is located) facing each other. The relative positioning may be done laterally within ±2 μm. The second wafer 2' was selected based on criteria similar to those used for the wafer 2, and particularly in terms of precision of the thickness of the semiconducting surface layer. A treatment similar to the first wafer 2 was applied to it.

The wafers thus obtained are assembled (FIG. 2H) using a direct or indirect transfer technique, with or without the addition of intermediate material. The volume made may be precise due to the assembly of semiconducting wafers, with a precision of the alignment between each of the wafers of the order of 2 to 5 μm.

A thinning and/or polishing step may then also be performed in this case.

The product obtained may possibly be reworked by etching processes or by mechanical processes (thinning, planing of one and/or both "bulk" substrates) so as to obtain the final structure (FIG. 2I). This structure comprises at least two valves 24, 24', through which a fluid can circulate under pressure to lift the membrane of the corresponding seat 20, 20'.

This example in FIG. 2A and subsequent Figures shows compatibility of the process with collective working on a single wafer, since several zones can be made in the surface layer of the same semiconducting material 4 with the same precisions (see FIG. 2C).

FIGS. 3A-3F show another embodiment of a process according to the invention, in which a cover 80 is also made that will be assembled, for example with a device like that shown in FIG. 2I.

In an SOI wafer 52, comprising a surface layer 54 of semiconducting material, a dielectric layer 56 and a substrate 58 (or "bulk"), patterns define one or several cavities 62, 62', on the front and/or back face delimiting a membrane 64 between them.

The layers 70, 70' shown in FIGS. 3A-3D are layers made for example of nitride, similar to layers 10, 10' in FIG. 1C. These Figures show chaining of the steps used to make the cover.

Figure 3A:
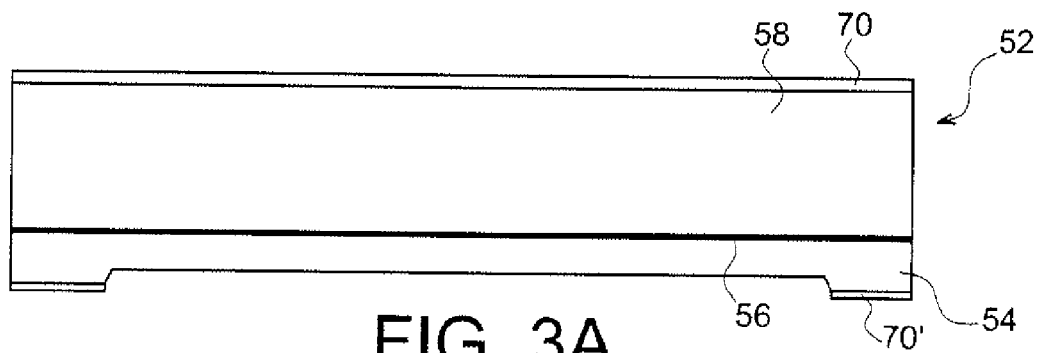
FIGS. 3A-3F show a third embodiment of a process according to the invention.
Figure 3B:
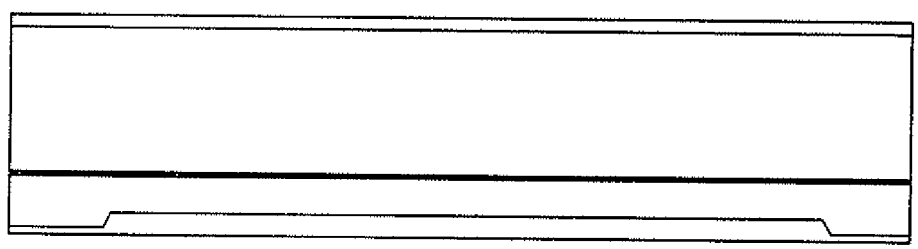
Figure 3C:
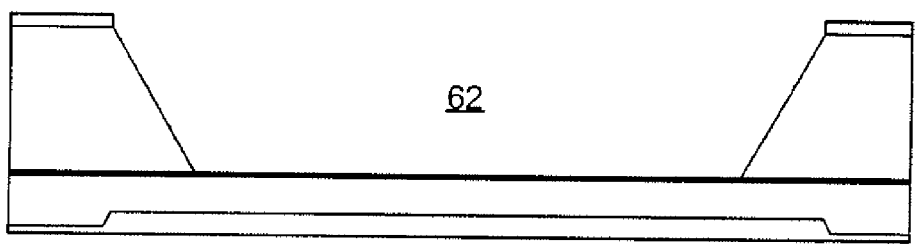
Figure 3D:
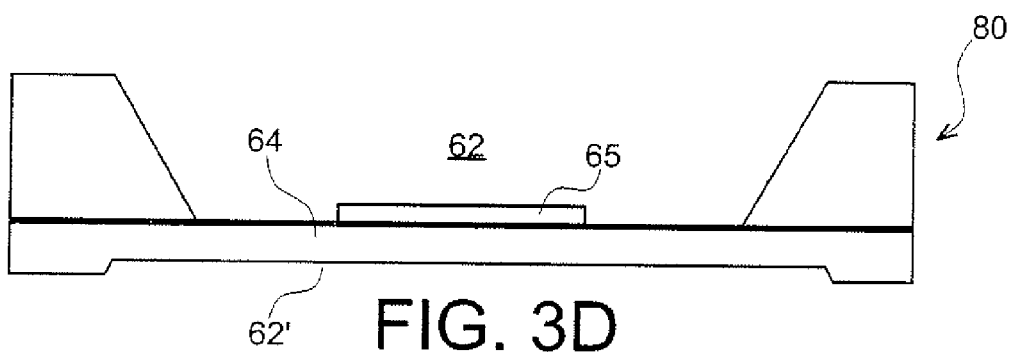
Figure 3E:
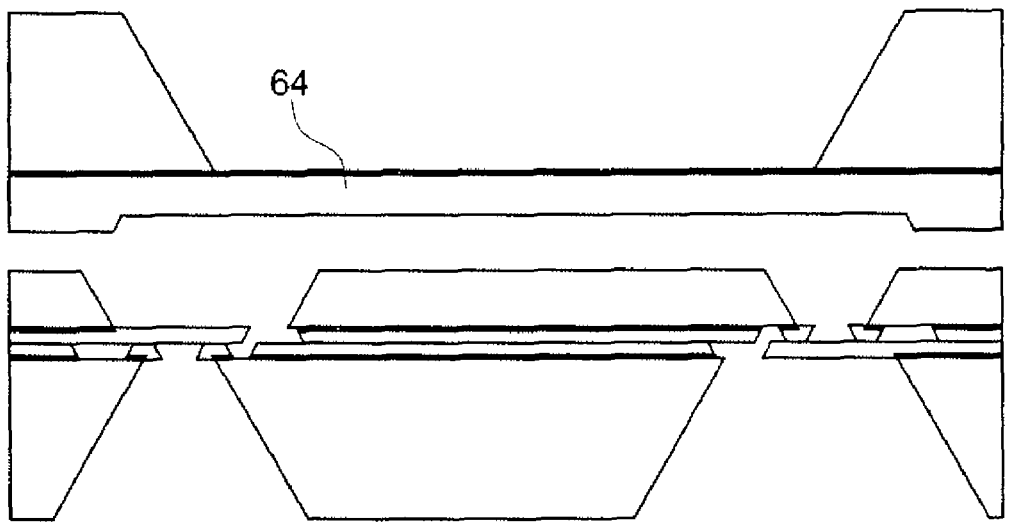

A piezoelectric material 65 may be deposited in the cavity 62 made in the cover (FIG. 3D).

Figure 3F:
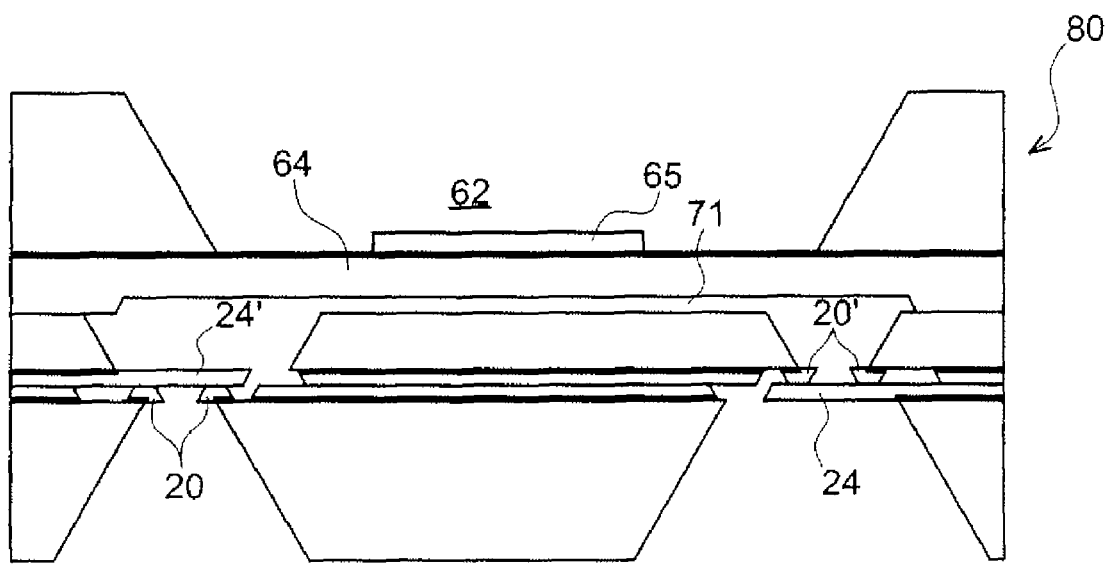

The assembly thus obtained may be placed facing a device like that shown in FIG. 2I (FIG. 3E), and then be assembled with this device, for example by bonding (FIG. 3F). A chamber 71 can thus be formed between the two elements thus assembled, so as to allow a fluid to circulate from a site of a first valve 24' to a site of a second valve 24.

The result is a pump or a micropump type device in which the membrane 64 can be activated, for example by piezoelectric or electrostatic or magnetic or pneumatic means. Such means may be housed in the cavity 62. For example, this activation can be used to create a negative pressure in the chamber 71, that in turn leads to activation of the membrane 24', that lifts off its seat 20 allowing a micro-volume of fluid to pass through, for example of the order of a few picoliters or a few nanoliters.

Actuation of the membrane 64 in the reverse direction provides a means of circulating the fluid in the chamber 70, to a second site of a second valve 24 that it forces open when its pressure is sufficiently high.

Another embodiment of the invention will be described with reference to FIGS. 4A-4J.

Figure 4A:
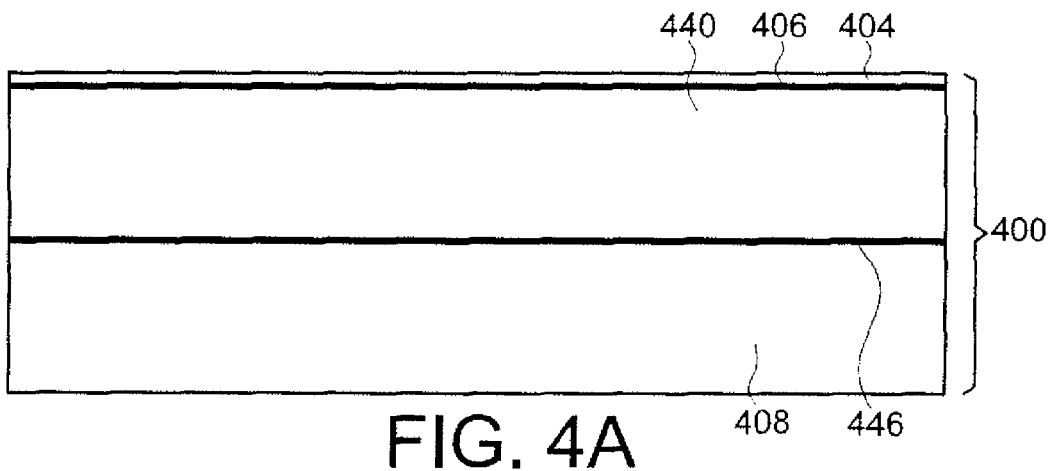
FIGS. 4A-4J show a fourth embodiment of a process according to the invention, in double SOI technology.
Figure 4B:
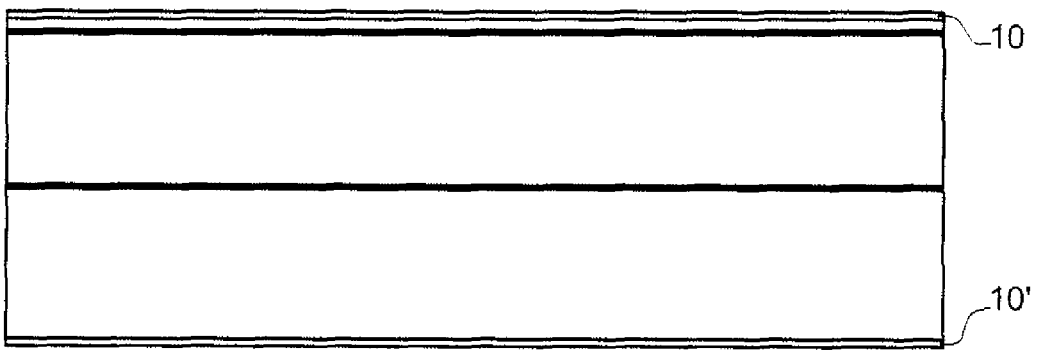
Figure 4C:
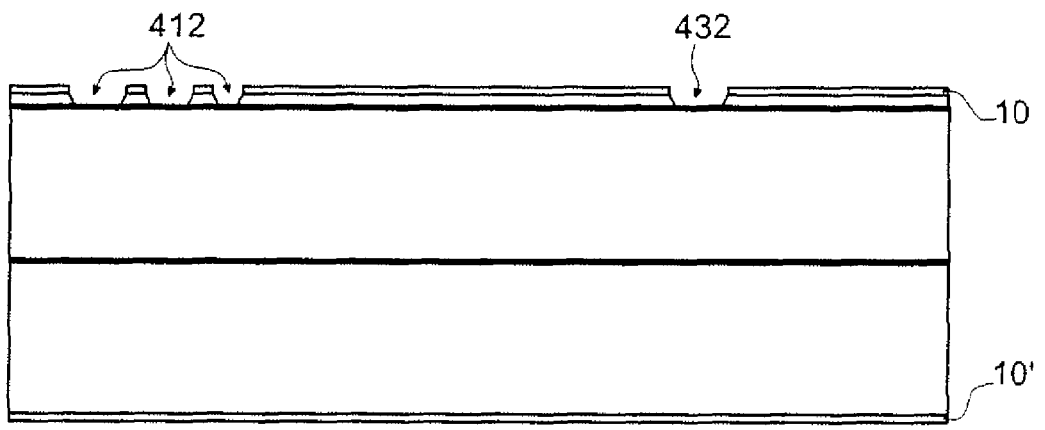

In this case, the objective is to use a "double SOI" type wafer 400 or more generally a double semiconductor on insulator type wafer comprising two films 404, 440 of semiconducting materials each with an adapted thickness. As shown in FIG. 4A, a double SOI structure comprises a first layer 404 of semiconducting material, for example monocrystalline silicon, under which there is a first buried layer 406 of insulator, for example silicon dioxide. The precision of the thickness of the layer 404 is the same as the precision of layer 4 in FIG. 1A, which will have the same advantages as those explained above, namely a guaranteed precision for every component (membrane or cavity) made in this layer by an etching process, the layer 406 acting as a stop layer.

This buried layer 406 is itself supported on a second layer 440 of a semiconducting material, for example monocrystalline silicon, which is itself supported on a second buried layer 446 of insulator, for example silicon dioxide.

The assembly is supported on a substrate 408, itself also made of a semiconducting material, for example silicon.

For example, the thicknesses of layers 404, 440 are typically about 1 to 100 μm, while the thicknesses of layers 406, 446 are of the order of 1 μm, for example between 0.1 μm and 2 μm.

A material 10, 10' (for example silicon nitride, or a metal, or an oxide, or a resin, etc.) designed to form a mask for the subsequent etching steps, is deposited (FIG. 4B) on each side of the wafer 400. This material is structured according to first patterns and the semiconducting film 404 is etched by a dry or wet etching process (FIG. 4C) to transfer said patterns (or pads and cavities) 412, 432 into the layer 404, the layer 406 forming the etching stop layer.

Figure 4D:
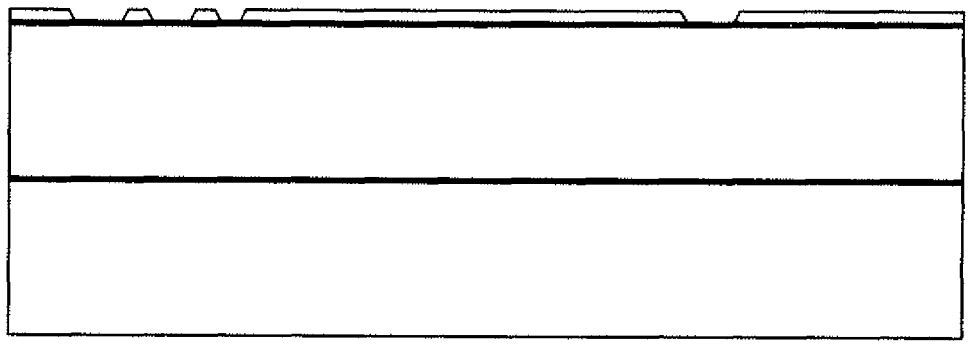
Figure 4E:
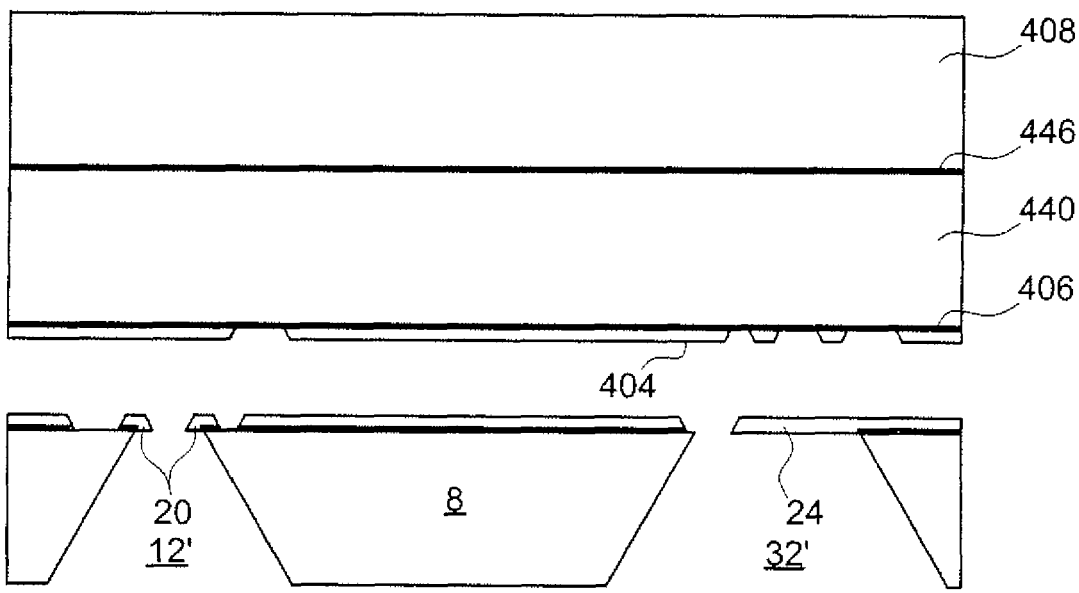
Figure 4F:
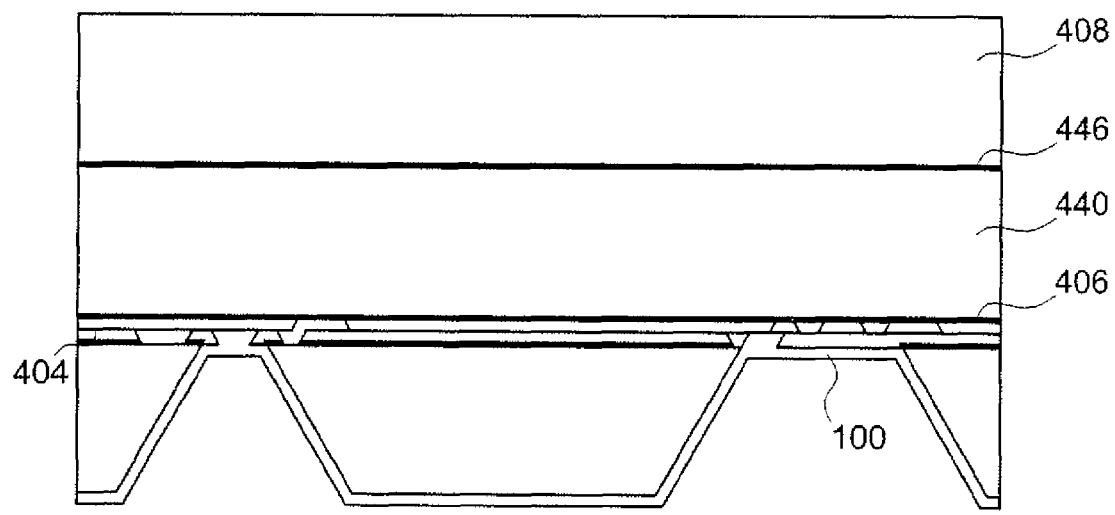
Figure 4G:
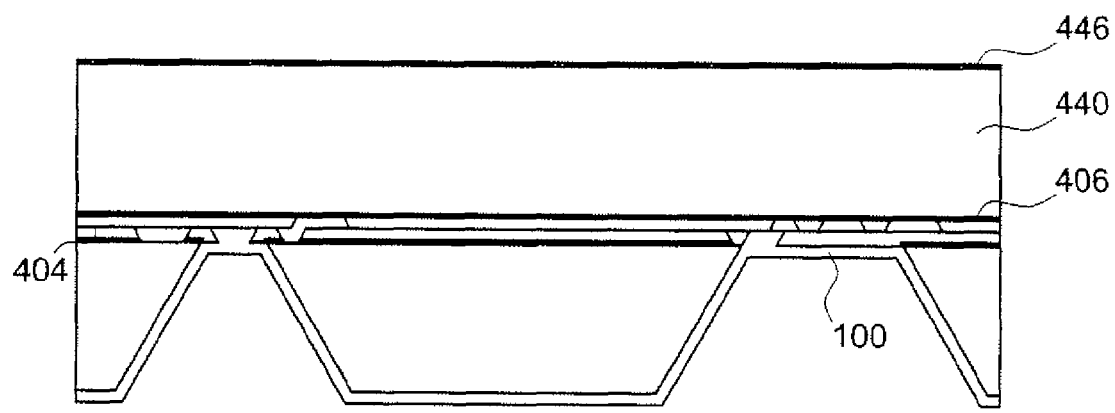

The layers 10, 10' are then eliminated (FIG. 4D).

A wafer like that shown in FIG. 2F is also made, in accordance with the explanations given above with reference to FIGS. 2A-2F.

The next step is to align these two wafers with respect to each other (FIG. 4E), the front faces (faces on which the surface layer 404, 24 of semiconducting material is located) facing each other. The relative positioning may be done laterally within ±2 μm.

The wafers thus obtained are assembled (FIG. 4F) by a direct or indirect transfer technique with or without the addition of an intermediate material. The volume made may be precise, by the assembly of semiconducting wafers, with the precision of the alignment between each of the wafers being of the order of 2 to 5 μm.

The product obtained may be thinned by eliminating the semiconducting substrate 408 (FIG. 4G), after protecting the back face of the second substrate by a layer 100, for example made of nitride.

The back face thus exposed on the first substrate can then be etched over the thickness of the layer 440, to expose cavities 412, 412' (FIG. 4H), for example by wet etching or by dry etching with a stop layer.

Figure 4H:
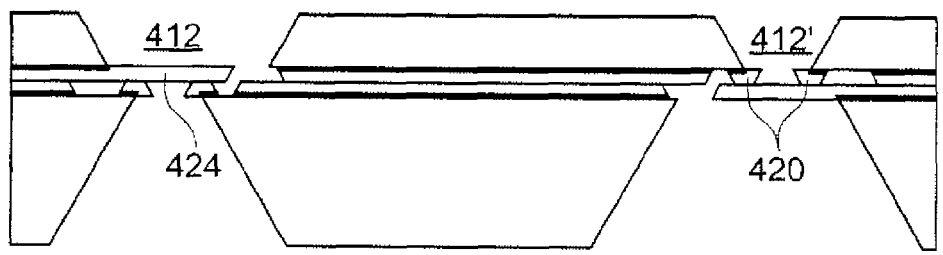
Figure 4I:
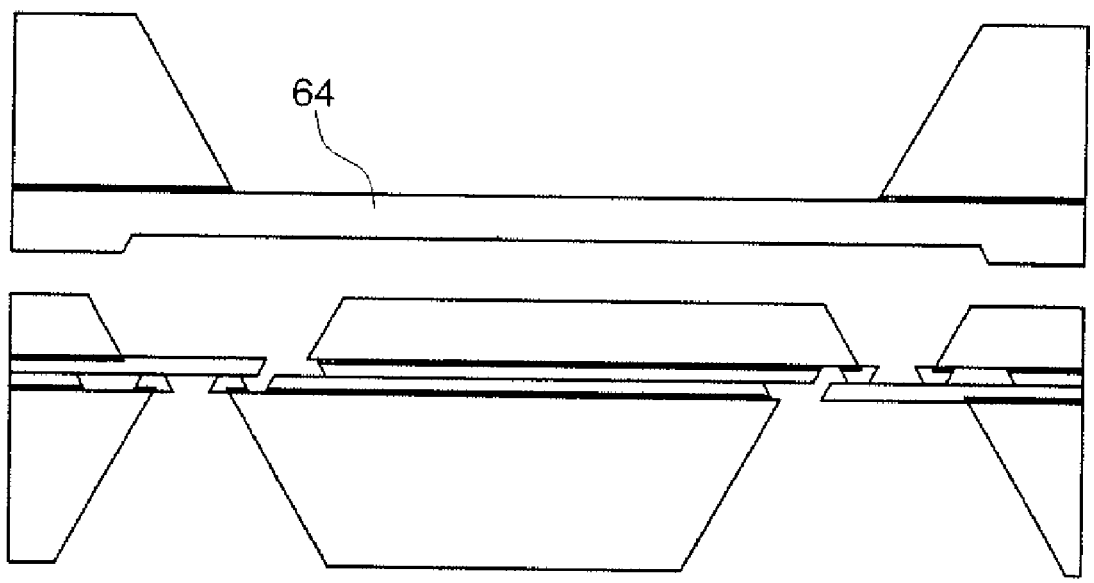
Figure 4J:
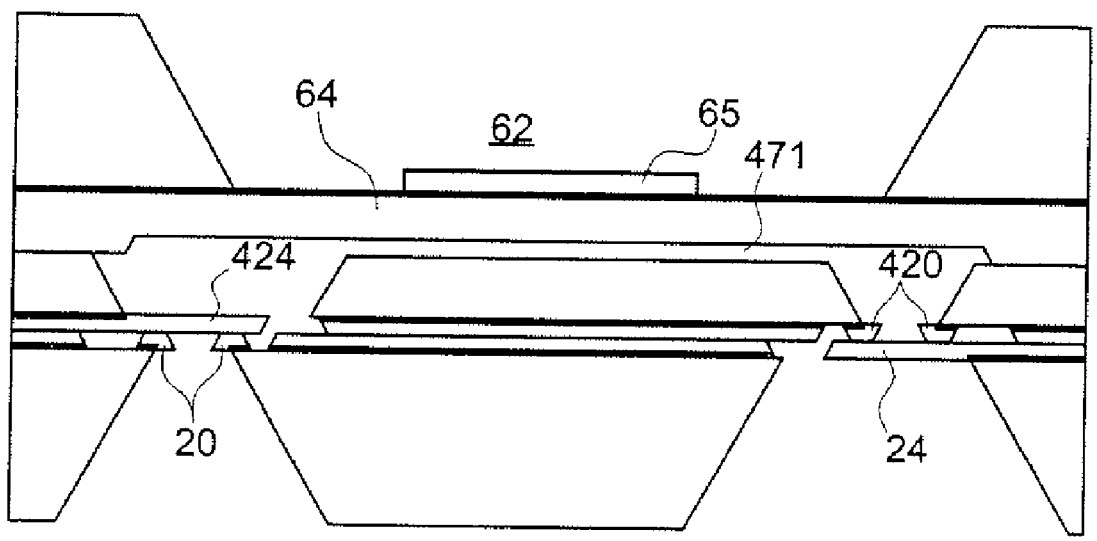

A cover 40 can also be made as described above with reference to FIGS. 3A to 3F, and can be positioned (FIG. 4I) facing a device like that in FIG. 4H, and can then be assembled with this device, for example by sealing (FIG. 4J). A chamber 471 is formed between the two elements thus assembled so as to allow a fluid to circulate from a site of a first valve 424 to a site of a second valve 24. A piezoelectric material 65 can be deposited in the cavity made in the cover.

The advantage of this embodiment is that the device is thinned simply by eliminating a semiconducting layer 408 of the double SOI substrate.

Therefore the invention relates to a process for collective manufacturing of cavities, and/or membranes, and/or valves, and/or micro-ducts and/or micropumps in semiconducting wafers with a high precision (tighter than or equal to a few micrometers, for example tighter than or equal to 2 µm, along the three dimensions). This process can also be used in batches, with no control during manufacturing. Manufacturing in batches enables several wafers to be machined at the same time instead of the known individual process used wafer by wafer.

A volume thus made is controlled by a precise preliminary check of the thickness of the etched film made possible by the use SOI wafers and other wafers with a semiconductor on insulator structure. The other dimensions are controlled by making a mask with precise dimensions. Therefore, the invention can be used to precisely control the dimensions of cavities and membranes created, independently of manufacturing conditions. The buried oxide or dielectric layer—that forms the stop layer—eliminates the effect of variations in the etching process (etching speed and homogeneity), the etched thickness being defined only by the thickness of the semiconducting film, for example made of silicon.

The presence of the buried oxide layer avoids the need for any dimensional check during the etching process.

The invention enables collective or batch manufacturing.

An ultra precise control over the dimensions of cavities and membranes is achieved and is limited only by the tolerance on the thickness of the surface film of semiconducting material at the surface of the chosen wafer, and this tolerance can be less than one micrometer.

The dimensions obtained are independent of the chosen etching process and its variability.

A process according to the invention also enables very good reproducibility and very good manufacturing homogeneity.

The invention claimed is:

1. Process for making a closed or semi-closed volume, involving a first and second semiconductor on insulator type wafers, each of these wafers comprising at least one semiconducting surface layer on an electrically insulating layer, this insulating layer being itself supported on a substrate, this process comprising:
   in the first semiconductor on insulator type wafer, etching of the semiconducting surface layer, the insulating layer forming an etch-stop layer, wherein a portion of the insulating layer in contact with the substrate is not removed, to make at least one cavity,
   in the second semiconductor on insulator type wafer, etching of the semiconducting surface layer, the insulating layer forming an etch-stop layer, wherein a portion of the insulating layer in contact with the substrate is not removed, to make at least one membrane,
   etching of the substrate and the electrically insulating layer of the first and second wafers,
   alignment of said two wafers,
   assembly of said two wafers, so as to position said membrane against said cavity, said membrane acting as a valve for said cavity,
   a thinning step performed on at least one of the two wafers, after assembly of these two wafers.

2. Process according to claim 1, said wafers being SOI wafers.

3. Process according to claim 2, said wafers being EPI-SOI type wafers, obtained by epitaxy.

4. Process according to claim 1, one of said wafers being a double SOI wafer.

5. Process according to claim 1, also comprising positioning of a mask on or above the surface layer of said first and/or second wafer, before etching.

6. Process for manufacturing a micro valve, comprising:
   the formation of at least one seat of said micro-valve in a semiconducting surface layer of a first semiconductor on insulator wafer, this insulating layer being itself supported on a substrate, by etching of said semiconducting surface layer, the insulating layer forming an etch-stop layer, wherein a portion of the insulating layer in contact with the substrate is not removed,
   the formation of at least one membrane of said micro-valve in a semiconducting surface layer of a second semiconductor on insulator wafer, this insulating layer being itself supported on a substrate, by etching of said semiconducting surface layer, the insulating layer forming an etch-stop layer, wherein a portion of the insulating layer in contact with the substrate is not removed,
   etching of the substrate and the electrically insulating layer of the first and second wafers,
   assembly of said first and second wafers, so as to position the membrane on the seat.

7. Process according to claim 6, also comprising:
   the formation of at least one membrane in at least said first wafer, and at least one seat in the surface layer of the semiconducting material of said first wafer, and at least one seat and at least one membrane in the surface layer of semiconducting material of said second wafer,
   assembly of said first and second wafers, forming at least two micro-valves.

8. Process according to claim 1, further comprising a step to make a cover in a third wafer, and a step to assemble this cover with said first and second wafers.

9. Process according to claim 8, said third wafer being an SOI wafer.

10. Process according to claim 8, said cover comprising at least one membrane.

11. Process according to claim 10, also comprising the formation of activation means of said at least one membrane, for example piezoelectric or electrostatic or magnetic or pneumatic activation means.

12. Process according to claim 10, said at least one membrane being delimited by two cavities made in the third wafer.

13. Process according to claim 1, said two wafers being assembled by direct or indirect bonding, with or without the addition of intermediate material.

14. Process according to claim 1, said two wafers being assembled by molecular bonding.

15. Process according to claim 1, the semiconducting surface layer of said first and/or second wafers being made of silicon (Si) or of SiGe.

16. Process according to claim 1, the insulating layer of said first and/or second wafers being an oxide layer or a nitride layer.

* * * * *